United States Patent
Sun

(10) Patent No.: US 10,194,540 B2
(45) Date of Patent: Jan. 29, 2019

(54) SUPPORTING DEVICE OF FLEXIBLE DISPLAY PANEL, AND DISPLAY APPARATUS

(71) Applicant: BOE TECHNOLOGY GROUP CO., LTD., Beijing (CN)

(72) Inventor: Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/529,703

(22) PCT Filed: Sep. 9, 2016

(86) PCT No.: PCT/CN2016/098576
§ 371 (c)(1),
(2) Date: May 25, 2017

(87) PCT Pub. No.: WO2017/063469
PCT Pub. Date: Apr. 20, 2017

(65) Prior Publication Data
US 2017/0374750 A1      Dec. 28, 2017

(30) Foreign Application Priority Data
Oct. 12, 2015   (CN) .......................... 2015 1 0659415

(51) Int. Cl.
*H05K 5/00*           (2006.01)
*H01L 51/52*          (2006.01)
(Continued)

(52) U.S. Cl.
CPC ....... *H05K 5/0017* (2013.01); *H01L 51/0097* (2013.01); *H01L 51/5237* (2013.01);
(Continued)

(58) Field of Classification Search
CPC .... H05K 5/0017; H05K 5/0217; H05K 3/301; H05K 7/14; H05K 7/1474; H05K 7/1417;
(Continued)

(56) References Cited

U.S. PATENT DOCUMENTS 9,081,540 B1 * 7/2015 Cho ........................ G06F 1/1601
9,123,290 B1 * 9/2015 Cho ........................ G06F 1/1652
(Continued)

FOREIGN PATENT DOCUMENTS

CN            103814403 A        5/2014
CN            103915041 A        7/2014
(Continued)

OTHER PUBLICATIONS

International Search Report dated Nov. 29, 2016.
First Chinese Office Action dated Apr. 22, 2016.

*Primary Examiner* — Steven T Sawyer
*Assistant Examiner* — Sagar Shrestha
(74) *Attorney, Agent, or Firm* — Dilworth & Barrese, LLP; Michael J. Musella, Esq.

(57) ABSTRACT

A supporting device of a flexible display panel, and display apparatus are provided. The supporting device includes a plate-like support component and a curvature adjusting component combined with the plate-like support component, wherein the plate-like support component includes two opposite outer peripheral portions, at least one portion of the curvature adjusting component is disposed between the two outer peripheral portions, and a structure of the curvature adjusting component is configured to enable the two outer peripheral portions of the plate-like support component to be bent toward the side of the plate surface provided with the plate-like support component, such that a curved support surface having a varying curvature can be obtained.

5 Claims, 8 Drawing Sheets

(51) Int. Cl.
  *H05K 5/02* (2006.01)
  *H01L 51/00* (2006.01)
  *H01L 27/32* (2006.01)
  *G09F 9/30* (2006.01)

(52) U.S. Cl.
  CPC ........... *H05K 5/0217* (2013.01); *G09F 9/301* (2013.01); *H01L 27/3244* (2013.01); *H01L 2251/5338* (2013.01)

(58) Field of Classification Search
  CPC ......... H01L 51/5237; H01L 2251/5338; H01L 27/3244; G06F 1/1637; G06F 1/1652; G09F 9/301
  See application file for complete search history.

(56) References Cited

U.S. PATENT DOCUMENTS

| | | | |
|---|---|---|---|
| 9,830,839 B2* | 11/2017 | Song | G09F 9/301 |
| 2012/0281367 A1* | 11/2012 | He | H05K 5/02 |
| | | | 361/728 |
| 2014/0198465 A1* | 7/2014 | Park | H05K 5/0226 |
| | | | 361/749 |
| 2014/0268584 A1* | 9/2014 | Song | H05K 7/02 |
| | | | 361/728 |
| 2014/0376163 A1* | 12/2014 | Song | H04N 5/64 |
| | | | 361/679.01 |
| 2015/0185761 A1* | 7/2015 | Song | G06F 1/1601 |
| | | | 361/679.21 |
| 2015/0223358 A1* | 8/2015 | Nam | H05K 1/028 |
| | | | 361/749 |
| 2015/0293389 A1* | 10/2015 | Zhang | G02F 1/13336 |
| | | | 349/58 |
| 2015/0296641 A1* | 10/2015 | Song | H05K 5/0217 |
| | | | 361/679.01 |
| 2016/0040764 A1* | 2/2016 | Park | G09F 9/301 |
| | | | 361/679.01 |
| 2016/0044806 A1* | 2/2016 | Park | G02F 1/133305 |
| | | | 361/679.01 |
| 2017/0105301 A1* | 4/2017 | Sun | G09F 9/301 |

FOREIGN PATENT DOCUMENTS

| | | |
|---|---|---|
| CN | 104282231 A | 1/2015 |
| CN | 104639931 A | 5/2015 |
| CN | 104756176 A | 7/2015 |
| CN | 204480609 U | 7/2015 |
| CN | 204516278 U | 7/2015 |
| CN | 105160999 A | 12/2015 |
| EP | 1728951 A1 | 6/2006 |

* cited by examiner

260

SUPPORTING DEVICE OF FLEXIBLE DISPLAY PANEL, AND DISPLAY APPARATUS

TECHNICAL FIELD

Embodiments of the present disclosure relate to a supporting device for a flexible display panel and a display apparatus.

BACKGROUND

Along with continuous development of a display technology, a visual demand of people for display products becomes higher and higher. A curved surface television and other curved surface display products adapt to visual characteristics of a human body, which is beneficial to avoiding visual fatigue, is wide in viewing angle, strong in telepresence and good in 3D effect, is accepted and loved by customers more and more and gradually becomes a tendency of development.

In a process of manufacturing a display apparatus, firstly, a display panel is bent to a certain radian in advance by a specific process, then the bent display panel is fixed through a backlight module, and therefore a curved surface display apparatus is formed. However, a bending degree of a curved surface display panel manufactured in this way is fixed, which thus cannot meet diversified needs of application scenarios.

SUMMARY

An embodiment of the present disclosure provides a supporting device for a flexible display panel, comprising: a plate-shaped supporting component and a curvature adjusting component coupled to the plate-shaped supporting component, wherein, the plate-shaped supporting component includes two outer edge portions opposite to each other, at least a part of the curvature adjusting component is arranged between the two outer edge portions, and the curvature adjusting component is capable of bending the two outer edge portions of the plate-shaped supporting component towards a side of a plate surface of the plate-shaped supporting component, so as to obtain a bent supporting surface with different curvatures.

For example, in the supporting device provided by an embodiment of the present disclosure, the plate-shaped supporting component includes a first plate-shaped component and a second plate-shaped component disposed side by side, the first plate-shaped component has a first end portion close to the second plate-shaped component, the second plate-shaped component has a second end portion close to the first plate-shaped component, the curvature adjusting component includes at least one rotating shaft, the first end portion of the first plate-shaped component and the second end portion of the second plate-shaped component are connected to the at least one rotating shaft, and the first plate-shaped component and the second plate-shaped component are capable of pivoting around an axial direction where the at least one rotating shaft is located.

For example, in the supporting device provided by an embodiment of the present disclosure, the at least one rotating shaft includes a first rotating shaft and a second rotating shaft parallel to each other, a relative position of the first rotating shaft to the second rotating shaft is fixed, the first end portion of the first plate-shaped component is connected to the first rotating shaft and capable of rotating around an axial direction where the first rotating shaft is located, and the second end portion of the second plate-shaped component is connected to the second rotating shaft and capable of rotating around an axial direction where the second rotating shaft is located.

For example, in the supporting device provided by an embodiment of the present disclosure, the at least one rotating shaft includes a third rotating shaft, the first end portion of the first plate-shaped component is connected to the third rotating shaft and capable of rotating around an axial direction where the third rotating shaft is located, and the second end portion of the second plate-shaped component is connected to the third rotating shaft and capable of rotating around the axial direction where the third rotating shaft is located.

For example, in the supporting device provided by an embodiment of the present disclosure, the curvature adjusting component further includes a limiting component, and the limiting component fixes a relative position of the first plate-shaped component to the second plate-shaped component.

For example, in the supporting device provided by an embodiment of the present disclosure, further comprising a reinforcing rib arranged on the first plate-shaped component and/or the second plate-shaped component.

For example, in the supporting device provided by an embodiment of the present disclosure, shapes of the first plate-shaped component and the second plate-shaped component include a rectangle, a trapezoid and parallel strips.

For example, in the supporting device provided by an embodiment of the present disclosure, the plate-shaped supporting component further includes a third plate-shaped component located on a same side of the first plate-shaped component and the second plate-shaped component.

For example, in the supporting device provided by an embodiment of the present disclosure, an elastic modulus of the third plate-shaped component is less than those of the first plate-shaped component and the second plate-shaped component.

For example, in the supporting device provided by an embodiment of the present disclosure, the plate-shaped supporting component includes a fourth plate-shaped component, the curvature adjusting component includes at least one first elastic component, the at least one first elastic component is detachably connected to a main surface side of the fourth plate-shaped component, and the at least one first elastic component is capable of applying force to the fourth plate-shaped component so as to bend two outer edge portions of the fourth plate-shaped component towards a side of a plate surface of the fourth plate-shaped component.

For example, in the supporting device provided by an embodiment of the present disclosure, the fourth plate-shaped component includes a first groove provided on the main surface side, and the at least one first elastic component is detachably arranged on two opposite sides of the first groove in a straddling manner and/or is arranged in the first groove.

For example, in the supporting device provided by an embodiment of the present disclosure, the plate-shaped supporting component further includes a fifth plate-shaped component detachably installed on the main surface side of the fourth plate-shaped component, and the fifth plate-shaped component includes a second groove arranged to be communicated and overlapped with the first groove.

For example, in the supporting device provided by an embodiment of the present disclosure, the curvature adjusting component includes at least one second elastic component, and the at least one second elastic component is detachably arranged on two opposite sides of the second groove in a straddling manner and/or is arranged in the second groove.

For example, in the supporting device provided by an embodiment of the present disclosure, the first groove is not parallel to an edge of the fourth plate-shaped component.

For example, in the supporting device provided by an embodiment of the present disclosure, the at least one elastic component includes a spring and/or an elastomer.

At least one embodiment of the present disclosure provides a display apparatus, comprising a flexible display panel and a supporting device supporting the flexible display panel, wherein, the supporting device is the supporting device provided by any one of the embodiments of the present disclosure, and the flexible display panel is located on the side of the plate surface of a plate-shaped supporting component.

For example, in the display apparatus provided by an embodiment of the present disclosure, at least one rotating shaft is connected to the flexible display panel.

For example, in the display apparatus provided by an embodiment of the present disclosure, the plate-shaped supporting component further includes a third plate-shaped component located between the first plate-shaped component and the flexible display panel as well as between the second plate-shaped component and the flexible display panel, and the at least one rotating shaft is connected to the third plate-shaped component.

For example, in the display apparatus provided by an embodiment of the present disclosure, an elastic modulus of the third plate-shaped component is less than those of the first plate-shaped component and the second plate-shaped component.

For example, in the display apparatus provided by an embodiment of the present disclosure, a vertical projection of the first plate-shaped component on the flexible display panel and a vertical projection of the second plate-shaped component on the flexible display panel do not exceed a vertical projection of the third plate-shaped component on the flexible display panel.

BRIEF DESCRIPTION OF THE DRAWINGS

In order to clearly illustrate technical solutions of the embodiments of the disclosure, drawings needing to be used in the embodiments or in the related art will be introduced simply, and it is obvious that the described drawings are just a part of the embodiments of the present disclosure, but are not limitative of the present disclosure.

DETAILED DESCRIPTION

Figure 1:
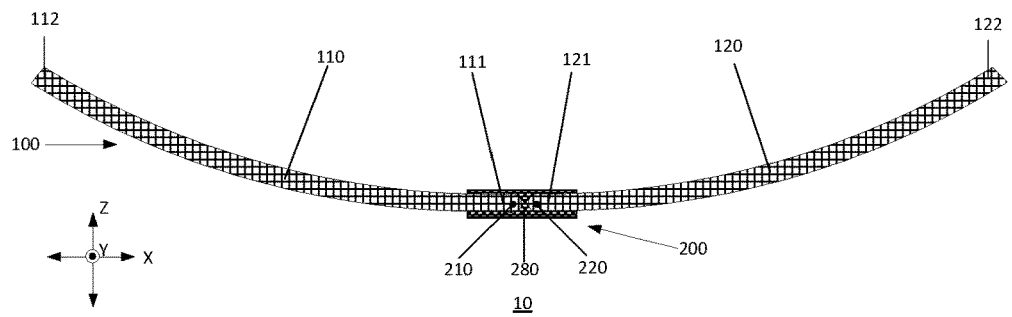
FIG. 1 is a sectional structure diagram of a supporting device for a flexible display panel provided by an embodiment of the present disclosure in an X-Z plane direction.

The technical solutions of the embodiments of the present disclosure will be described in a clearly and fully understandable way in connection with the drawings; and referring to non-limitative exemplary embodiments shown in the drawings and described in detail in following description, exemplary embodiments of the present disclosure and various characteristics and favorable details of the example embodiments of the present disclosure are illustrated more comprehensively. What should be noted is that, characteristics shown in the drawings are not necessarily drawn according to proportion. Description of known materials, assemblies and process technologies is omitted, and therefore the exemplary embodiments of the present disclosure are not made vague. Examples only aim at being favorable for understanding implementation of the exemplary embodiments of the present disclosure and further making those skilled in the art can implement the exemplary embodiments. Thus, examples should not be understood as limitation to the scope of embodiments of the present disclosure.

Unless otherwise defined, technical terms or scientific terms used in the present disclosure should have common sense understood by persons with general skills in the field to which the present disclosure belongs. "First" "second" and similar words used in the present disclosure do not show any order, number or importance and are only used for distinguishing different components. "Upper" "lower" "left" "right" and the like are only used for showing a relative position relationship, and after an absolute position of a described object is changed, the relative position relationship can also be correspondingly changed.

Figure 16:
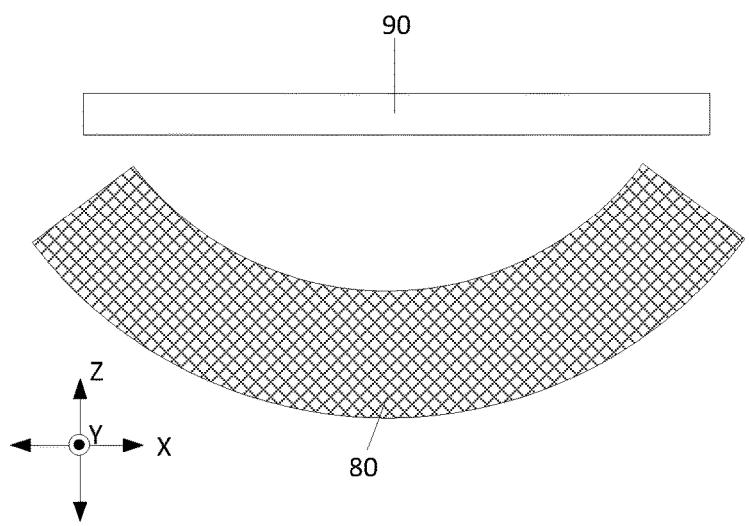
FIG. 16 is a sectional structure diagram of a flexible display panel and a bent supporting backplane in an X-Z plane direction before assembling, as provided by a technology.
Figure 17:
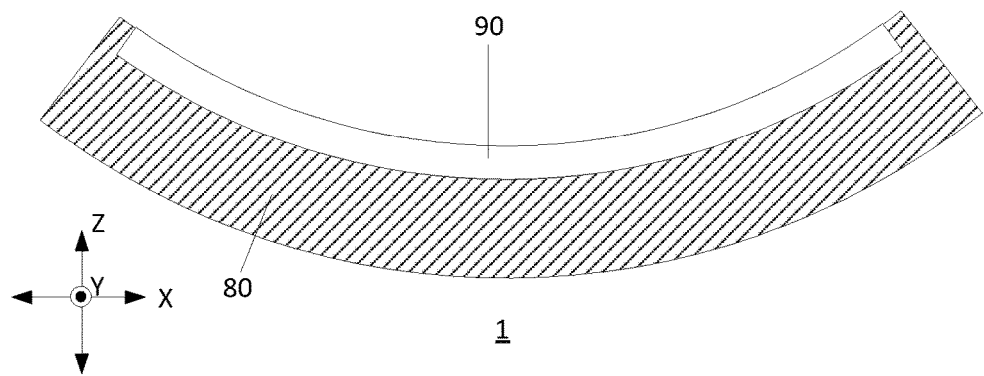
FIG. 17 is a sectional structure diagram of a display apparatus obtained by assembling the flexible display panel and the bent supporting backplane in FIG. 16 in an X-Z plane direction.

In a manufacturing process of a curved surface display apparatus, for example, in a manufacturing process of a large-sized curved surface display apparatus, one method is that external force can be directly applied at two ends of a flexible display flat panel to bend the display panel. FIG. 16 shows a flexible display panel 90 which is not bent and a supporting device (bent supporting backplane) 80 with an adjusted curvature. FIG. 17 shows a structure after the flexible display panel 90 is installed on the supporting device 80. For example, referring to FIGS. 16 and 17, the display panel 90 is arranged in the bent supporting backplane 80, resilience force of the panel 90 is counteracted by an external force from the bent supporting backplane 80, so that the display panel 90 can be kept in a bending form. Not only can the pre-bent supporting backplane 80 bear weight of the display panel 90, but also after the display panel 90 and the supporting backplane 80 are assembled, resilience force generated due to bending of the display panel is counteracted by the pre-bent supporting backplane 80, and finally, a display obtained after assembling reaches a stable bending radius. Generally, the bent supporting backplane 80 is in a shape of an arc and has small initial curvature. After the bent supporting backplane 80 and the display panel 90 are assembled, the resilience force of the display panel 90 is applied to the supporting backplane 80, which makes curvature of the bent supporting backplane 80 increased, and therefore the initial curvature of the bent supporting backplane 80 must be less than a target curvature of a display. In this way, after the display panel 90 is assembled onto the bent supporting backplane 80, under an action of the resilience force of the display panel 90, the curvature of the bent supporting backplane 80 is increased, and then a design curvature of a whole display apparatus is achieved. But, because the resilience force of the display panel, an arc shape of the bent supporting backplane, a pre-bending radius, a thickness, a density and homogeneity are relatively fixed, as for a same panel, supporting backplanes with different pre-bending curvatures are needed for achieving display screen with different curvatures, and therefore the bent supporting backplanes in various models are formed, which is not favorable for manufacturing cost and product management.

An embodiment of the present disclosure provides a supporting device for a flexible display panel and a display apparatus adopting the supporting device. By changing a bending degree of a supporting backplane, the flexible display panel can be in different curvature radius, and therefore a curvature-variable display apparatus can be achieved. The supporting device for the flexible display panel includes a plate-shaped supporting component and a curvature adjusting component coupled to the plate-shaped supporting component, wherein, the plate-shaped supporting component includes two outer edge portions opposite to each other, at least one part (namely, part or whole) of the curvature adjusting component is arranged between the two outer edge portions, and the curvature adjusting component is capable of bending the two outer edge portions of the plate-shaped supporting component towards a side of a plate surface of the plate-shaped supporting component, so as to obtain a bent supporting surface with different curvatures.

First Embodiment

Hereinafter, a supporting device for a flexible display panel provided by the first embodiment of the present disclosure will be described referring to FIGS. 1 to 6C.

As shown in FIG. 1, the supporting device 10 provided by the first embodiment of the present disclosure, includes a plate-shaped supporting component 100 and a curvature adjusting component 200 coupled to the plate-shaped supporting component 100. The plate-shaped supporting component 100 includes a first outer edge portion 112 and a second outer edge portion 122 which are opposite to each other. At least a part of the curvature adjusting component 200 is arranged between the two outer edge portions 112 and 122. The curvature adjusting component 200 is configured to bend the two outer edge portions 112 and 122 of the plate-shaped supporting component 100 towards one side of a plate surface of the plate-shaped supporting component, so as to obtain a bent supporting surface with different curvatures.

As shown in FIG. 1, the plate-shaped supporting component 100 includes a first plate-shaped component 110 and a second plate-shaped component 120 disposed side by side. The first plate-shaped component 110 has a first end portion 111 close to the second plate-shaped component 120 and the first outer edge portion 112 away from the second plate-shaped component 120; the second plate-shaped component 120 has a second end portion 121 close to the first plate-shaped component 110 and the second outer edge portion 122 away from the first plate-shaped component 110. Herein, the first outer edge portion 112 of the first plate-shaped component 110 and the second outer edge portion 122 of the second plate-shaped component 120 are two opposite outer edge portions of the plate-shaped supporting component 100. The curvature adjusting component 200 includes at least one rotating shaft, the first end portion 111 of the first plate-shaped component 110 and the second end portion 121 of the second plate-shaped component 120 are connected to the at least one rotating shaft, the first plate-shaped component 110 and the second plate-shaped component 120 are configured to pivot around an axial direction where the at least one rotating shaft is located, so as to obtain the bent supporting surface with the different curvatures.

For example, as shown in FIG. 1, in the supporting device 10 provided by an embodiment of the present disclosure, the curvature adjusting component 200 includes a first rotating shaft 210 and a second rotating shaft 220 which are parallel to each other and have a fixed relative position. For example, the fixed relative position of the first rotating shaft 210 to the second rotating shaft 220 can achieve through a shaft sleeve 280. The shaft sleeve 280, for example, can be sleeved at two opposite ends of the first rotating shaft 210 and the second rotating shaft 220 in a Y direction (in a direction perpendicular to a paper surface), as shown in FIG. 5 and FIGS. 6A-6C. Herein, the relative position of the first rotating shaft 210 to the second rotating shaft 220 is fixed, refers to that positions of the first rotating shaft 210 and the second rotating shaft 220 in an axial direction (parallel to the Y direction) are fixed relative to each other. The relative positional relationship of the first rotating shaft 210 and the second rotating shaft 220 is not limited by the embodiment of the present disclosure. In an example, the first rotating shaft 210 and the second rotating shaft 220 can be arranged to not parallel to each other, for example, an angle is formed, and therefore a non-cylindrical bent supporting surface can be obtained. In a case that the relative position of the first rotating shaft 210 to the second rotating shaft 220 are fixed, the first rotating shaft 210 and the second rotating shaft 220 can respectively rotate with respect to respective axial directions. The first rotating shaft 210 and the second rotating shaft 220 are arranged between the first outer edge portion 112 and the second outer edge portion 122 of the plate-shaped supporting component 100 opposite to each other.

The first end portion 111 of the first plate-shaped component 100 is connected to the first rotating shaft 210 and capable of rotating around an axial direction where the first rotating shaft 210 is located, and the second end portion 121 of the second plate-shaped component 120 is connected to the second rotating shaft 220 and capable of rotating around an axial direction where the second rotating shaft 220 is located. For example, the first plate-shaped component 110 and the second plate-shaped component 120 can be fixedly connected to the first rotating shaft 210 and the second rotating shaft 220 respectively. For example, a gear, a belt, a screw and the like are driven through a stepping motor or manually to drive the first rotating shaft 210 and the second rotating shaft 220 to rotate, and then, the first plate-shaped component 110 and the second plate-shaped component 120 can be driven to respectively rotate in axial directions where the first rotating shaft 210 and the second rotating shaft 220 are located, so that the first plate-shaped component 110 and the second plate-shaped component 120 can make opening and closing movement around the axial directions where the first rotating shaft 210 and the second rotating shaft 220 are located. For example, the first plate-shaped component 110 and the second plate-shaped component 120 can symmetrically rotate with respect to the first rotating shaft 210 and the second rotating shaft 220 respectively; or they can also asymmetrically rotate with respect to the first rotating shaft 210 and the second rotating shaft 220 respectively. The first plate-shaped component 110 and the second plate-shaped component 120 can synchronously rotate with respect to the first rotating shaft 210 and the second rotating shaft 220 respectively; or they can also non-synchronously rotate with respect to the first rotating shaft 210 and the second rotating shaft 220 respectively.

In the embodiment shown in FIG. 1, an upper surface of the first plate-shaped component 110 and an upper surface of the second plate-shaped component 120, for example, are provided as the bent supporting surface of the plate-shaped supporting component 100. The two outer edge portions 112 and 122 of the plate-shaped supporting component 100 are driven by the first rotating shaft 210 and the second rotating shaft 220 to bent towards an upper side or a lower side of the plate surface of the plate-shaped supporting component 100 (that is, towards an upper side or a lower side of the first plate-shaped component 110 and the second plate-shaped component 120), so as to obtain the bent supporting surface with the different curvatures. The flexible display panel can be coupled to the bent supporting surface, so that different curvatures can be obtained when supported by different bent supporting surfaces. In a case that the flexible display panel is coupled to the bent supporting surface, the flexible display panel can make full contact with the bent supporting surface, or can also make partial contact with the bent supporting surface.

Figure 2:
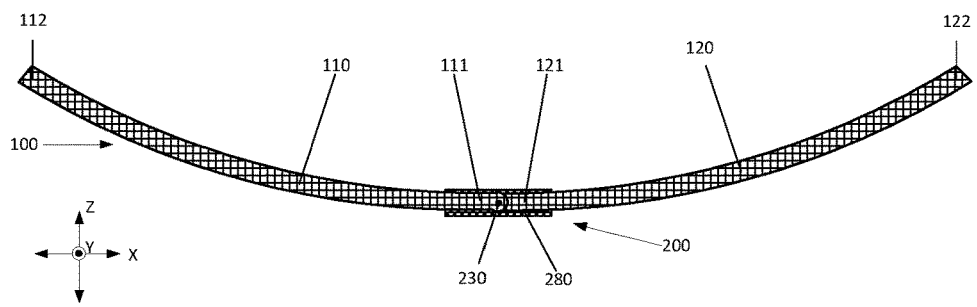
FIG. 2 is a sectional structure diagram of a supporting device for the flexible display panel provided by an embodiment of the present disclosure in an X-Z plane direction.

Alternatively, in an example, as shown in FIG. 2, the curvature adjusting component 200 includes one rotating shaft, namely the third rotating shaft 230. The first end portion of 111 the first plate-shaped component 110 is connected to the third rotating shaft 230 and capable of rotating around an axial direction where the third rotating shaft 230 is located. For example, the first end portion 111 of the first plate-shaped component 110 is rotationally sleeved on the third rotating shaft 230. The second end portion 121 of the second plate-shaped component 120 is connected to the third rotating shaft 230 and capable of rotating around the axial direction where the third rotating shaft 230 is located. For example, the second end portion 121 of the second plate-shaped component 120 is rotationally sleeved on the third rotating shaft 230. For example, the portion of the first plate-shaped component 110 sleeved on the third rotating shaft 230 and the portion of the second plate-shaped component 120 sleeved on the third rotating shaft 230 are distributed in a staggered manner in the axial direction where the third rotating shaft 230 is located, so that the first plate-shaped component 110 and the second plate-shaped component 120 can independently rotate with respect to the third rotating shaft 230. For example, the shaft sleeve 280 can be sleeved at two opposite ends of the third rotating shaft 230 in a Y direction.

Figure 3:
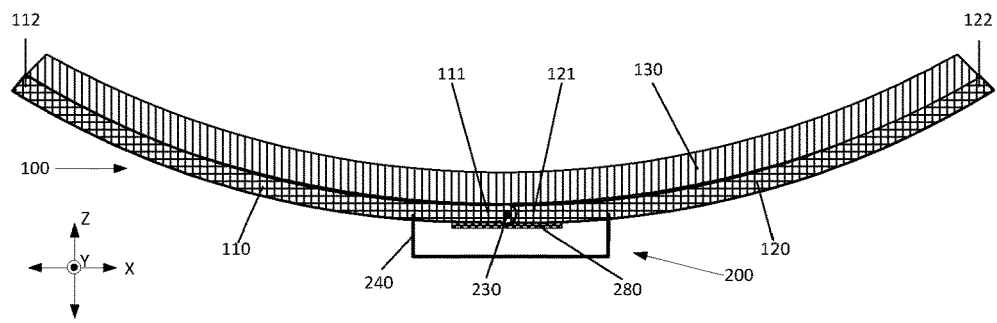
FIG. 3 is a sectional structure diagram of the supporting device for the flexible display panel provided by an embodiment of the present disclosure in an X-Z plane direction.

In an example, as shown in FIG. 3, the plate-shaped supporting component 100 can also include a third plate-shaped component 130 located on one side of the first plate-shaped component 110 and the second plate-shaped component 120. The first plate-shaped component 110 and the second plate-shaped component 120 can apply acting force to the third plate-shaped component through rotation, so as to change a curvature of the third plate-shaped component. Thus, the three plate-shaped components 110, 120 and 130 provide a stable bent supporting surface as a whole. In the embodiment, as shown in FIG. 3, an upper surface of the third plate-shaped component 130 can provide a bent supporting surface. In this case, a flexible display panel can be arranged on an upper surface of the third plate-shaped component 130, so that a corresponding curvature can be obtained.

In an example, the shaft sleeve 280 sleeved at two opposite ends of the first rotating shaft 210 and the second rotating shaft 220 can be connected to the third plate-shaped component 130 through a screw or can be attached and fixed to the third plate-shaped component 130, or can be integrally formed with the third plate-shaped component 130.

For example, an elastic modulus of the third plate-shaped component 130 can be less than those of the first plate-shaped component 110 and the second plate-shaped component 120. That is to say, the third plate-shaped component 130 is prone to bending deformation compared to the first plate-shaped component 110 and the second plate-shaped component 120. In this way, the first plate-shaped component 110 and the second plate-shaped component 120 can apply acting force to the third plate-shaped component 130 through rotation, and can easily change a curvature of the third plate-shaped component 130, so that a better supporting and bending effect for the display panel coupled to the upper surface of the third plate-shaped component 130 can be provided. For example, materials for forming the first plate-shaped component 110, the second plate-shaped component 120 and the third plate-shaped component 130 can include metal, carbon fiber, organic glass, ceramic and the like.

With further reference to FIG. 3, for example, the curvature adjusting component 200 can also include a limiting component 240, and the limiting component 240 can be configured to fix relative position of the first plate-shaped component 110 to the second plate-shaped component 120. For example, the limiting component 240 can be a rigid fixing piece, the rigid fixing piece can be inserted into a hole or a groove preset in a lower surface of the first plate-shaped component 110 and the second plate-shaped component 120 to achieve the fixed relative position of the first plate-shaped component 110 to the second plate-shaped component 120. For another example, the limiting component 240 can be a limiting block arranged on the third rotating shaft 230, and configured for limiting and locking a rotating angle between the first plate-shaped component 110 and the second plate-shaped component 120. It is understood that, examples of the limiting component are not limited to the above manner, and any component capable of fixing the relative position of the first plate-shaped component 110 to the second plate-shaped component 120 can be adopted as a limiting component in the embodiment of the present disclosure. For example, in the embodiment as shown in FIG. 1, in a case that the first plate-shaped component 110 and the second plate-shaped component 120 can be fixedly connected to the first rotating shaft 210 and the second rotating shaft 220 respectively and the first rotating shaft 210 and the second rotating shaft 220 are driven by a stepping motor to rotate, the stepping motor can also have an effect of limiting rotation of the first rotating shaft 210 and the second rotating shaft 220 to fix the relative position of the first rotating shaft 210 to the second rotating shaft 220, and therefore the stepping motor itself can serve as a limiting component.

Figure 4:
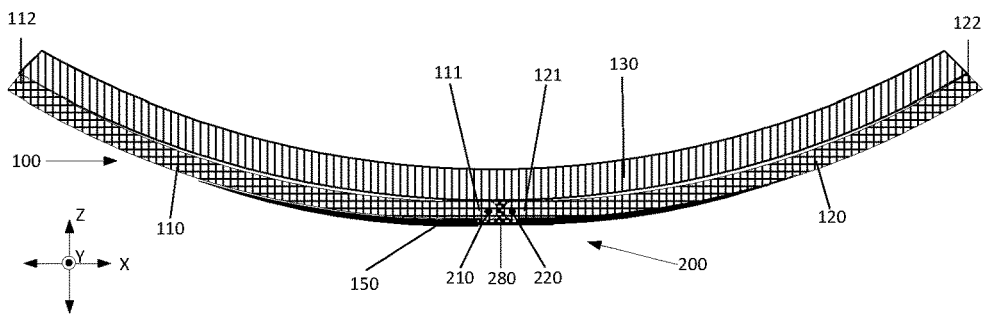
FIG. 4 is a sectional structure diagram of a supporting device for a flexible display panel provided by an embodiment of the present disclosure in an X-Z plane direction.
Figure 5:
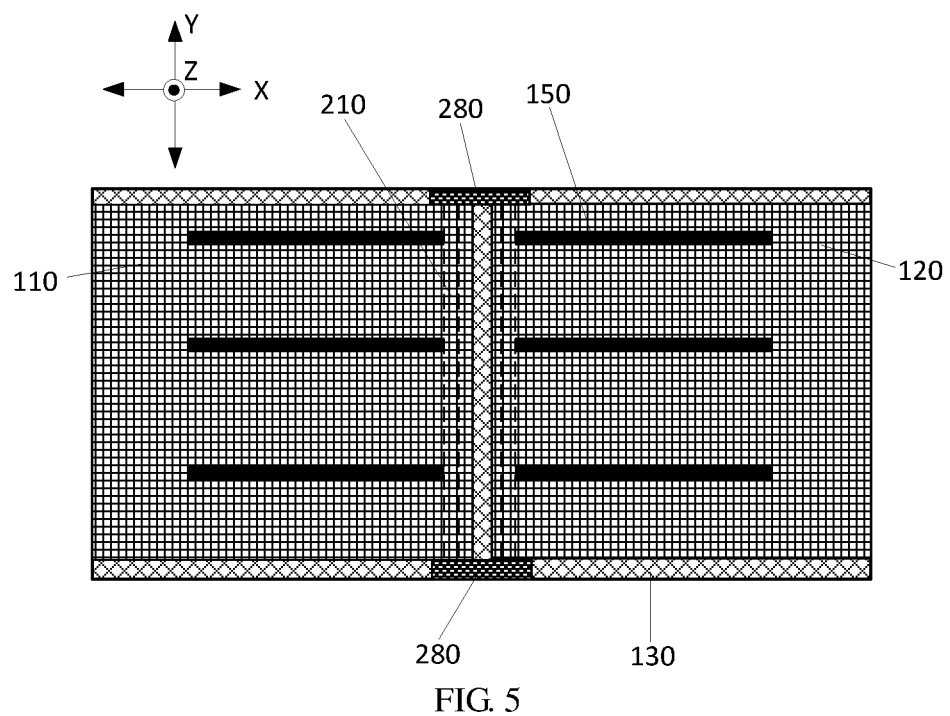
FIG. 5 is a top-view structure diagram of a supporting device for a flexible display panel provided by an embodiment of the present disclosure on an X-Y plane.

For example, as shown in FIGS. 4 and 5, the supporting device provided by the embodiment of the present disclosure can also includes a reinforcing rib arranged on the first plate-shaped component 110 and/or the second plate-shaped component 120, so as to correspondingly enhance a supporting strength of the first plate-shaped component 110 and/or the second plate-shaped component 120. For example, the reinforcing ribs 150 are arranged on lower surfaces of the first plate-shaped component 110 and the second plate-shaped component 120, and each reinforcing rib 150 is arranged in an X direction as shown in FIGS. 4 and 5. For example, as shown in FIG. 5, the reinforcing ribs 150 can be in a shape of strip and are arranged on the lower surfaces of the first plate-shaped component 110 and the second plate-shaped component 120 separately. Positions, shapes and numbers of the reinforcing ribs 150 are not limited to the above case. For example, the reinforcing ribs 150 can also be arranged on upper surfaces of the first plate-shaped component 110 and the second plate-shaped component 120. The numbers and the shapes of the reinforcing ribs can be adjusted according to elastic modulus, weight, hardness and other parameters of the first plate-shaped component 110, the second plate-shaped component 120 and the flexible display panel. For example, the reinforcing rib can also be in a shape of an X-shaped sheet, a rectangular piece, a combination of a triangular strip and a rectangular piece, and the like. The reinforcing rib 150 can be independently manufactured, and then is connected to the first plate-shaped component 110 and/or the second plate-shaped component 120 through a screw, riveted or welded to the first plate-shaped component 110 and/or the second plate-shaped component 120, or is integrally machined and formed with the first plate-shaped component 110 and/or the second plate-shaped component 120.

In the above embodiment, the first plate-shaped component 110, the second plate-shaped component 120 and the third plate-shaped component 130 can respectively have a shape of an arc surface.

Figure 6A:
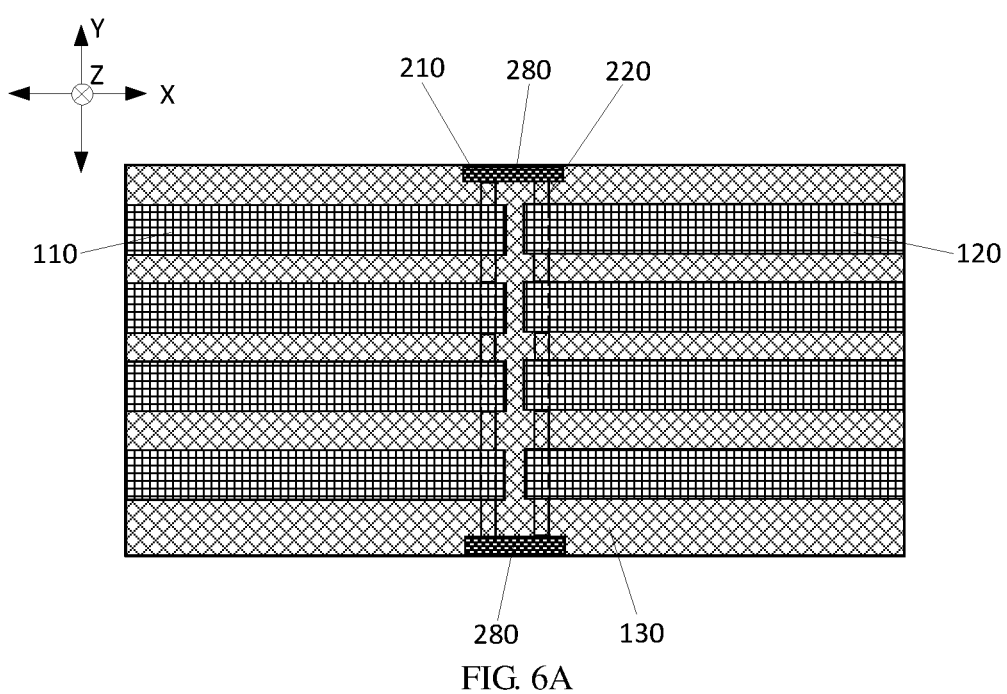
FIGS. 6A to 6C are top-view structure diagrams of a first plate-shaped component and a second plate-shaped component of a supporting device for a flexible display panel provided by an embodiment of the present disclosure.
Figure 6B:
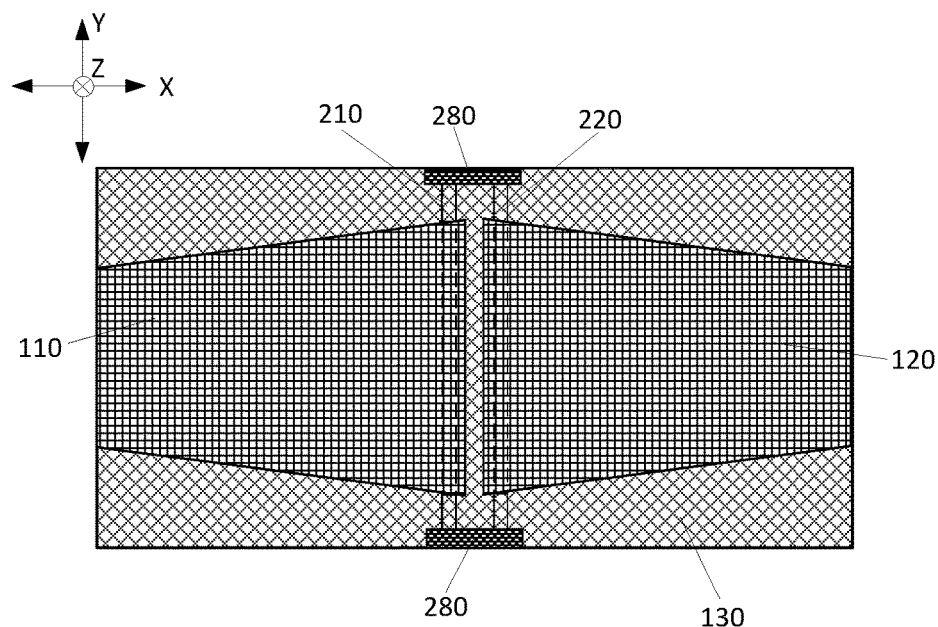
Figure 6C:
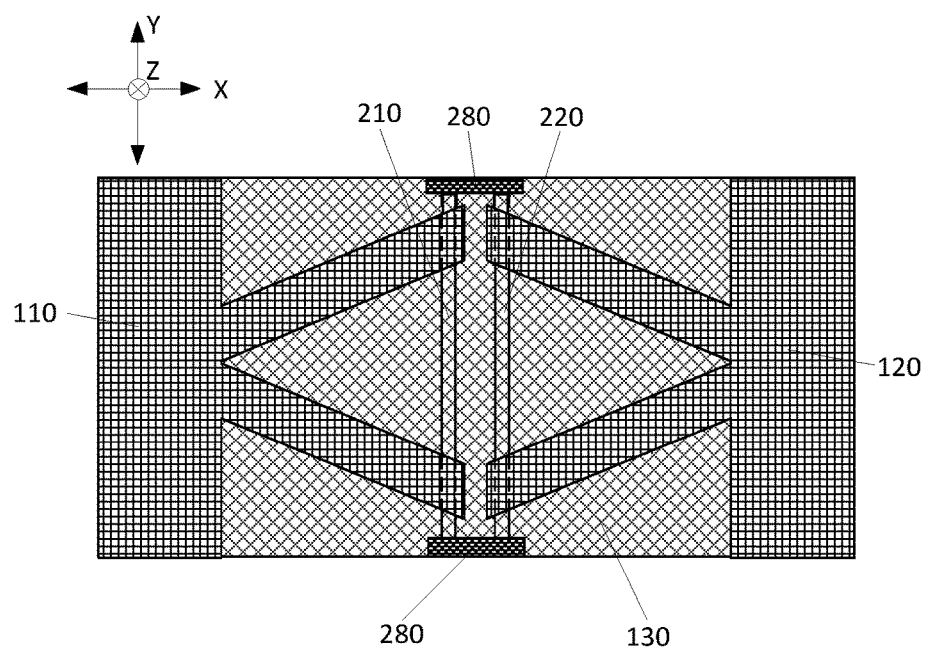

In order to meet requirements of the different application scenarios, shapes of the first plate-shaped component 110 and the second plate-shaped component 120 in an XY plane in the embodiment of the present disclosure are not limited to a rectangular shape. FIGS. 6A to 6C show some shape examples of the first plate-shaped component 110 and the second plate-shaped component 120 in the XY plane in the embodiment of the present disclosure. For example, as shown in FIG. 6A, the first plate-shaped component 110 and the second plate-shaped component 120 can respectively include a plurality of strip-shaped structures parallel to each other; as shown in FIG. 6B, the first plate-shaped component 110 and the second plate-shaped component 120 can have a trapezoid shape; as shown in FIG. 6C, the first plate-shaped component 110 and the second plate-shaped component 120 can have a shape of a combination of a V shape and a rectangle. In an example, the first plate-shaped component 110 and the second plate-shaped component 120 can have different plane shapes.

In the supporting device for the flexible display panel provided by the first embodiment of the present disclosure, the first plate-shaped component and the second plate-shaped component rotate around a Y direction, and therefore the bent supporting surface with the different curvatures for the flexible display panel can be provided, the flexible display panel coupled to the bent supporting surface can have different curvature radius, and curvature-variable display is achieved. In the embodiment, the outer edge portion of the supporting device does not necessarily being overlapped with an outer side edge of the supported display panel and does not necessarily being a straight side, either, and for example, can be in an irregular shape.

Second Embodiment

Hereinafter, a supporting device for a flexible display panel provided by the second embodiment of the present disclosure will be described referring to FIGS. 7 to 13.

Figure 7:
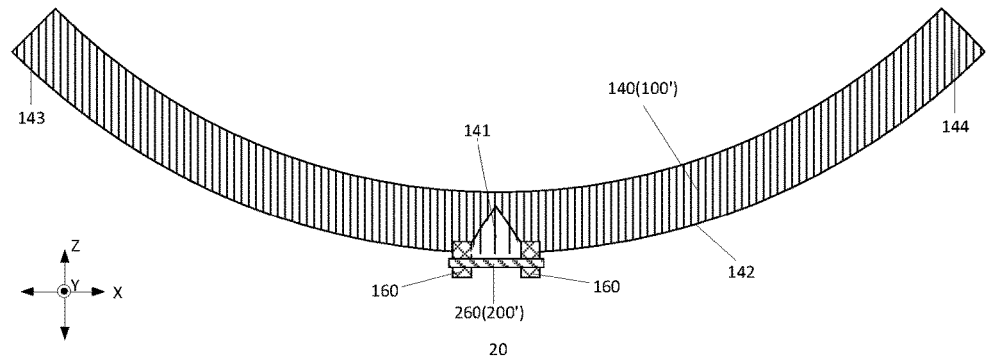
FIG. 7 is a sectional structure diagram of a supporting device for a flexible display panel provided by an embodiment of the present disclosure in an X-Z plane direction.

For example, as shown in FIG. 7, the supporting device 20 provided by the first embodiment of the present disclosure, includes a plate-shaped supporting component 100' and a curvature adjusting component 200' coupled to the plate-shaped supporting component 100'. The plate-shaped supporting component 100' includes a first outer edge portion 143 and a second outer edge portion 144 which are opposite to each other. The curvature adjusting component 200' is arranged between the two outer edge portions 143 and 144. The curvature adjusting component 200' is configured to bend the two outer edge portions 143 and 144 of the plate-shaped supporting component 100' towards one side of a plate surface of the plate-shaped supporting component, so as to obtain a bent supporting face with different curvatures.

In the supporting device 20 provided by the second embodiment of the present disclosure, the plate-shaped supporting component 100' includes a fourth plate-shaped component 140, the curvature adjusting component 200' includes at least one first elastic component 260, and the at least one first elastic component 260 is detachably connected to a main surface side 142 of the fourth plate-shaped component 140. The at least one first elastic component 260 is configured to apply force to the fourth plate-shaped component 140 so that the third outer edge portion 143 and the fourth outer edge portion 144 of the fourth plate-shaped component 140 can be bent towards an upper side or a lower side of a plate surface of the fourth plate-shaped component 140 to form a bent supporting surface. In FIG. 7, an upper surface of the fourth plate-shaped component 140 can be provided as the bent supporting surface. Thus, the flexible display panel can be arranged on the upper surface of the fourth plate-shaped component 140. By adjusting force applied to the fourth plate-shaped component 140 by the first elastic component 260, curvature of the fourth plate-shaped component 140 can be adjusted. For example, the first elastic component 260 installed on the main surface side 142 of the fourth plate-shaped component 140 can be in a compressed state or in a stretched state.

For example, the fourth plate-shaped component 140 can be an arc-surface component uniform in thickness, and can also be a plate-shaped component with a thickness gradually reduced from middle to two ends.

For example, as shown in FIG. 7, in an example, the fourth plate-shaped component 140 further includes a first groove 141 provided on the main surface side 142. The at least one first elastic component 260 can be configured to be arranged at two outer opposite sides of the first groove 141 in a detachable manner. However, the present disclosure is not limited thereto. The first elastic component 260 can also be arranged on the two inner opposite sides of the first groove 141. The first elastic component 260 is arranged in the first groove 141 and can make the main surface side 142 smooth, and uniform appearance of a product and reduction of a thickness of the product can be achieved easily. In addition, because the main surface side 142 of the fourth plate-shaped component 140 is provided with the first groove 141, portions of the fourth plate-shaped component 140 located on the two opposite sides of the first groove 141 easily bent with respect to the first groove 141. Therefore, a curvature adjusting range of the fourth plate-shaped component 140 can be increased.

Figure 8:
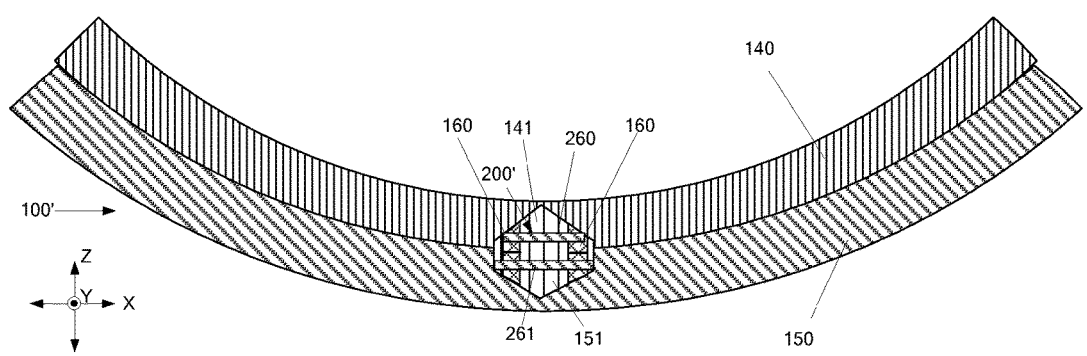
FIG. 8 is a sectional structure diagram of a supporting device for a flexible display panel provided by an embodiment of the present disclosure in an X-Z plane direction.

For example, as shown in FIG. 8, in an example, the plate-shaped supporting component 100' can also include a fifth plate-shaped component 150 detachably installed on the main surface side 142 of the fourth plate-shaped component 140; The fifth plate-shaped component 150 is provided with a second groove 151 communicated and overlapped with the first groove 141. In another example, the first groove 141 and the second groove 151 can be not communicated or overlapped with each other. For example, lengths of the fifth plate-shaped component 150 in an X direction and a Y direction can be respectively greater than that of the fourth plate-shaped component 140 in corresponding directions. For example, lengths of the second groove 151 in the X direction and the Y direction can be respectively greater than or less than that of the first groove 141 in the corresponding directions, the first groove 141 and the second groove 151 can be completely overlapped, or can also be partially overlapped. For example, the first groove 141 and the second groove 151 have a V-shaped cross section.

For example, as shown in FIG. 8, the curvature adjusting component 200' cam also include at least one second elastic component 261, and the at least one second elastic component 261 is configured to be detachably arranged on two opposite sides of the second groove 151 in a detachable manner and/or to be arranged in the second groove 151. For example, the first elastic component 260 and the second elastic component 261 are respectively arranged in the first groove 141 and the second groove 151 and respectively apply thrust or tensile force to the first groove 141 and the second groove 151. Therefore, a curvature of the fourth plate-shaped component 140 and a curvature of the fifth plate-shaped component 150 can respectively change. For example, the fourth plate-shaped component 140 and the fifth plate-shaped component 150 are coupled together through an additional locking device and generate a stable bent supporting surface through interaction. In another example, the second elastic component 261 in the second groove 151 of the fifth plate-shaped component 150 can be omitted. In still another example, the second groove 151 of the fifth plate-shaped component 150 can also be omitted.

Figure 9A:
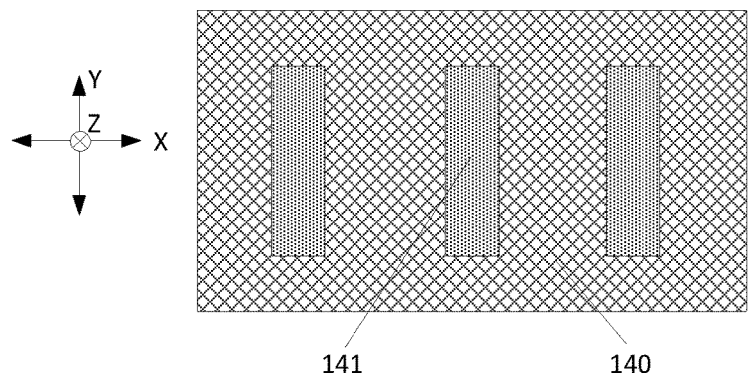
FIGS. 9A to 9D are examples of arrangement modes of a first groove in an embodiment of the present disclosure.
Figure 9B:
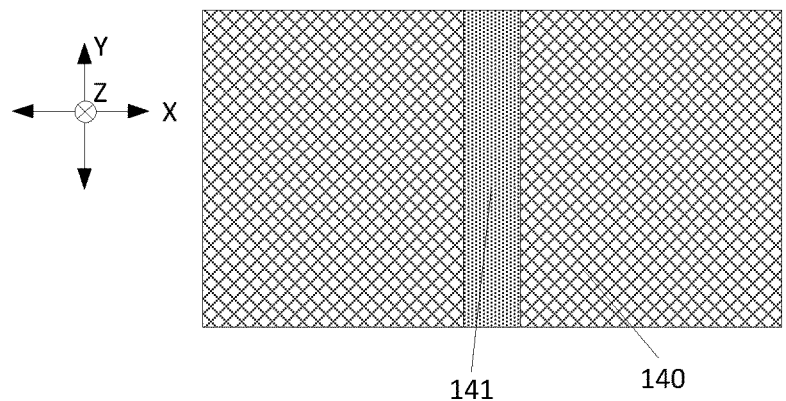
Figure 9C:
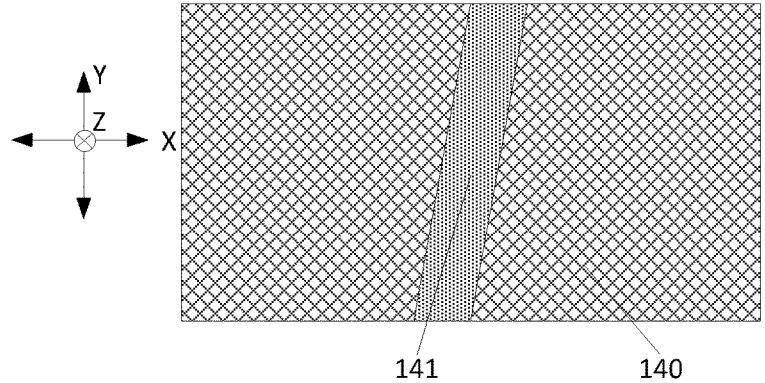
Figure 9D:
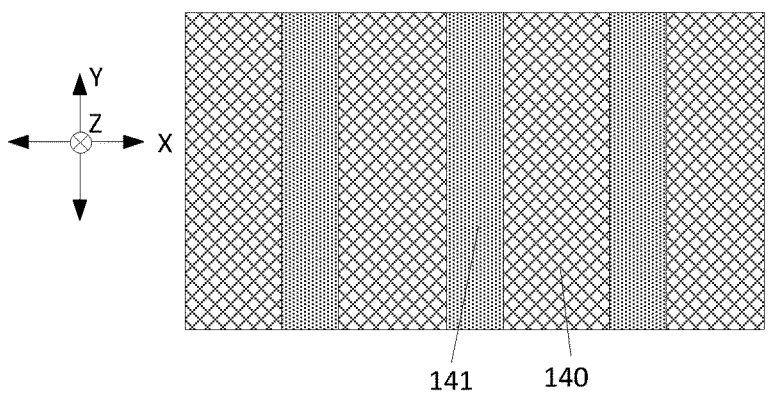

For example, in the supporting device 10 provided by the second embodiment of the present disclosure, the first groove 141 and the second groove 151 can be parallel to an edge of the fourth plate-shaped component 140 respectively, that is to say, are arranged to be parallel to a Y direction (as shown in FIGS. 9A, 9B and 9D), can also be not parallel to the edge of the fourth plate-shaped component 140, that is to say, are not arranged to be parallel to the Y direction, but form an acute angle or an obtuse angle (as shown in FIG. 9C) with the Y direction. For example, as shown in FIG. 9A, the fourth plate-shaped component 140 and the fifth plate-shaped component 150 can respectively have a plurality of first grooves 141 and second grooves 151, and an increase in the number of the grooves can make curvature of the fourth plate-shaped component 140 and curvature of the fifth plate-shaped component 150 change more easily and make a shape of the formed bent supporting surface more changeable. For example, as shown in FIGS. 9B to 9D, the first groove 141 and the second groove 151 can respectively pass through the fourth plate-shaped component 140 and the fifth plate-shaped component 150 in the Y direction; or they may not pass through the fourth plate-shaped component 140 and the fifth plate-shaped component 150, but only arranged on a middle portion of the fourth plate-shaped component 140 and the fifth plate-shaped component 150. When the plurality of first grooves 141 and second grooves 151 are provided, a part of the grooves pass through the fourth plate-shaped component 140 and/or the fifth plate-shaped component 150 in the Y direction, and another part of the grooves do not pass through the fourth plate-shaped component 140 and/or the fifth plate-shaped component 150 in the Y direction.

The at least one first elastic component and the at least one second elastic component include a spring and/or an elastomer.

Figure 10:
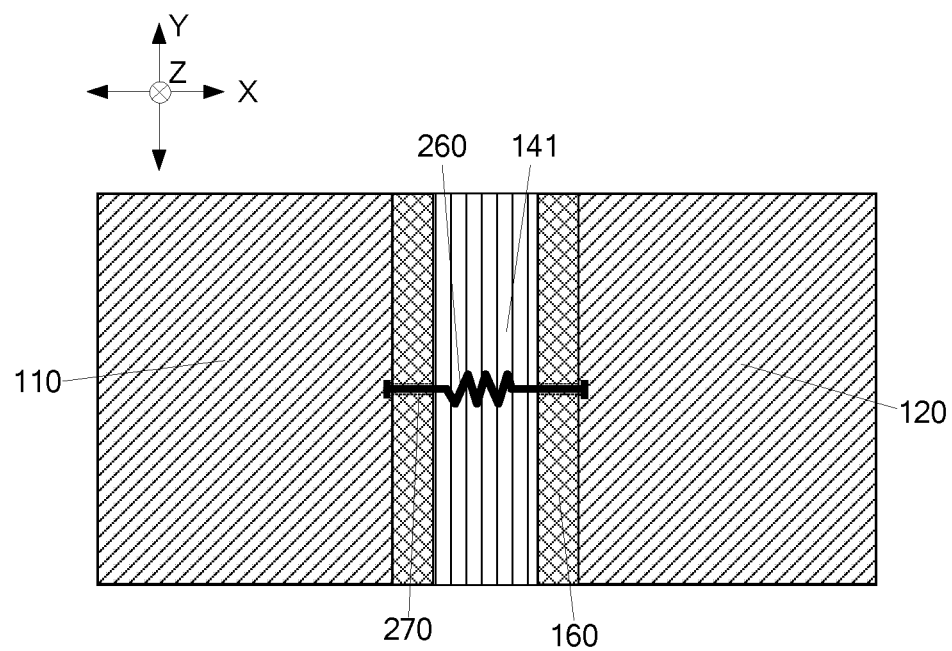
FIG. 10 is a top-view structure diagram of a supporting device for a flexible display panel provided by an embodiment of the present disclosure on an X-Y plane.

For example, the at least one first elastic component and the at least one second elastic component are both springs. As shown in FIGS. 7, 8 and 10, a force bearing block 160 is arranged on the lower surface of the fourth plate-shaped component 140, and the force bearing block 160 is fixedly connected with the fourth plate-shaped component 140. The force bearing block 160 is provided with spring fixing holes 270, a spring serving as the first and/or second elastic component can be connected to the force bearing block 160 through the spring fixing hole 270, and thus is connected to the fourth plate-shaped component 140. For example, the force bearing block 160 can be made of metal, glass, ceramic, polymer and other materials not prone to deformation and good in rigidity. For example, a material of the force bearing block 160 can be consistent with that of the fourth plate-shaped component 140. In addition, one end or two ends of the spring is/are provided with a buckle connected to the force bearing block 160, to achieve detachable connection with the force bearing block 160 and the fourth plate-shaped component 140. Of course, a detachable connection manner is not limited to the buckle, and other similar manners capable of achieving datable connection can all be applied herein. Springs with different elastic modulus and/or different lengths can be conveniently replaced due to the detachable connection manner, and in turn by adjusting magnitude of tensile force or thrust applied by the spring to the force bearing block 160 and the fourth plate-shaped component 140, adjustment of different curvatures is achieved. Only the spring arrangement of the fourth plate-shaped component 140 is illustrated above, while spring or other elastic components can also be arranged on the fifth plate-shaped component 150 in a similar manner, which will not be repeated here. In addition, it is understood that, the force bearing block 160 in the above embodiment is not essential. For example, in a deformation of the embodiment as shown in FIG. 8, force bearing blocks 160 arranged on two opposite side walls of the first groove 141 can be omitted, for example, two ends of the first elastic component 260 (such as a spring) can be detachably connected to two opposite side walls of the first groove respectively; further, force bearing blocks 160 arranged on two opposite side walls of the second groove 151 and the second elastic component 261 installed on the force bearing block 160 can also be omitted.

Figure 11:
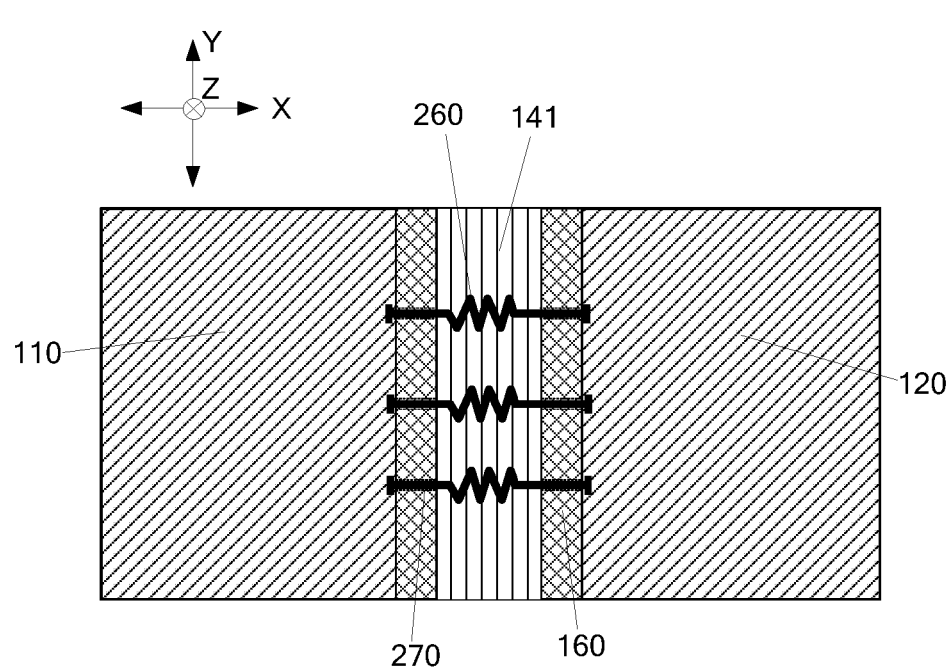
FIG. 11 is a top-view structure diagram of a supporting device for a flexible display panel provided by an embodiment of the present disclosure on an X-Y plane.

For example, as shown in FIG. 11, a plurality of springs serving as the first elastic component 260 can be provided across the first groove of the fourth plate-shaped component 140. According to different application requirements, the number of the springs can be adjusted; an increase or a decrease in the number of the springs can also adjust magnitude of the tensile force or the thrust applied by the springs to the force bearing block 160 and the fourth plate-shaped component 140, so as to achieve adjustment of the different curvatures. The fifth plate-shaped component 150 can also have a plurality of springs or other elastic components in one second groove of the fifth plate-shaped component 150.

Figure 12:
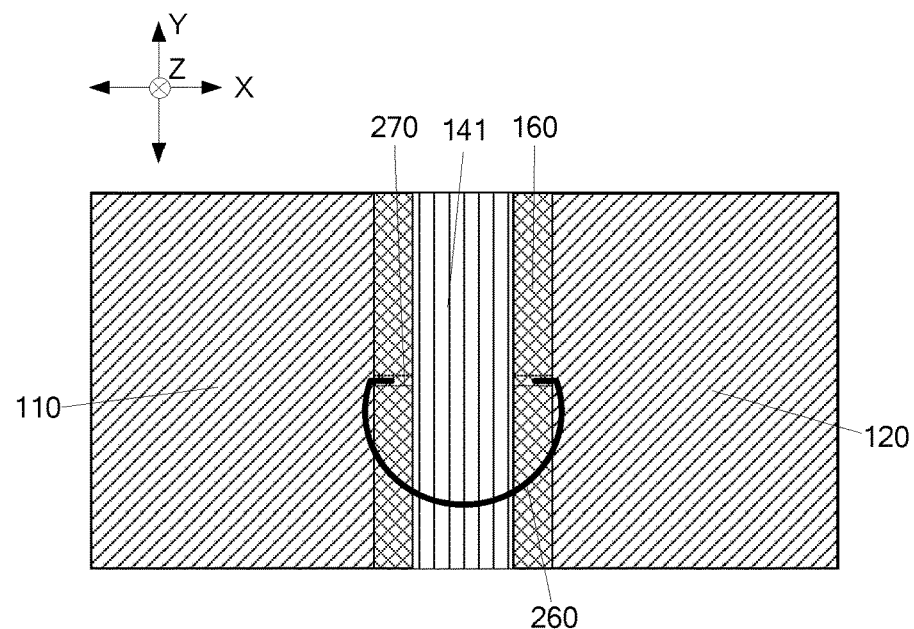
FIG. 12 is a top-view structure diagram of a supporting device for a flexible display panel provided by an embodiment of the present disclosure on an X-Y plane.
Figure 13:
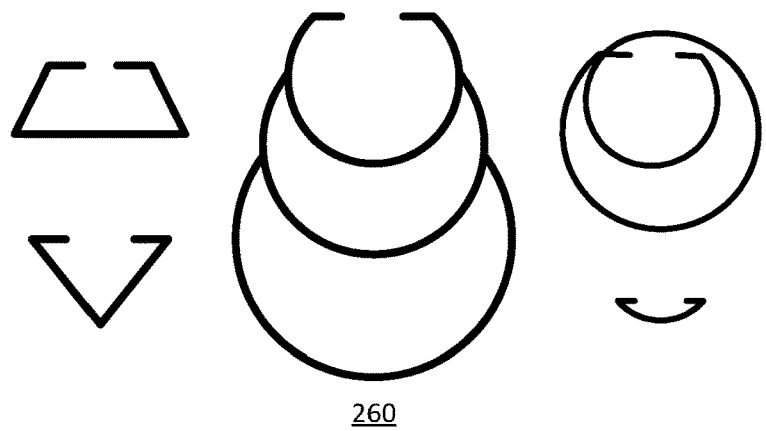
FIG. 13 is an example of an elastic component in an embodiment of the present disclosure.

For example, as shown in FIG. 12, a shape of the spring 260 is not limited to a strip-shaped spring and can also be a semicircular spring. FIG. 13 shows examples of some available springs, for example, including a triangular spring, a trapezoidal spring or various special-shaped springs. What should be understood is that, the embodiment of the present disclosure is not limited to the shape of the spring for use, and elastic components which can generate thrust or tensile force on the fourth plate-shaped component 140 can all be adopted.

For example, in a case that the at least one first and/or second elastic component is an elastomer, the elastomer can have a shape matched with the first and/or second groove so as to be detachably filled in the first and/or second groove. By changing the number and the elastic material of the elastomer filled in the first and/or second groove and serving as the first and/or second elastic component, curvature of the plate-shaped supporting component can be effectively adjusted. A material of the elastomer can be elastic resin, rubber and the like.

In the supporting device for the flexible display panel provided by the second embodiment of the present disclosure, by arranging springs with different tensile force strengths or in different numbers on a backside of the plate-shaped supporting component, an upper surface of the plate-shaped supporting component can be provided as the bent supporting surface with different curvatures. In this way, a curvature radius of the flexible display panel coupled to an upper surface of a plate-shaped supporting backplane can be adjusted. In the embodiment, an outer edge portion of the supporting device does not necessarily being overlapped with an outer side edge of the supported display panel and does not necessarily being a straight edge, either, and for example, can be in an irregular shape.

Third Embodiment

The third embodiment of the present disclosure provides a display apparatus 1 including a flexible display panel D and a supporting device configured to support the flexible display panel D, wherein, the supporting device D is a supporting device provided by any one of the above embodiments, and the flexible display panel D is located on one side of a bent supporting surface of a plate-shaped supporting component.

Figure 14:
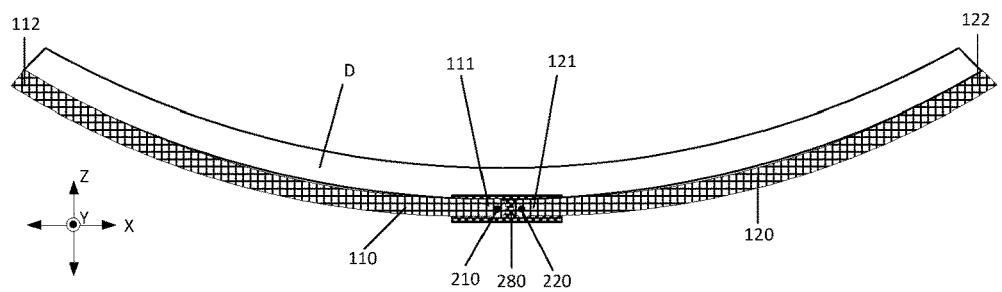
FIG. 14 is a sectional structure diagram of a display apparatus provided by an embodiment of the present disclosure in an X-Z plane direction.
Figure 15:
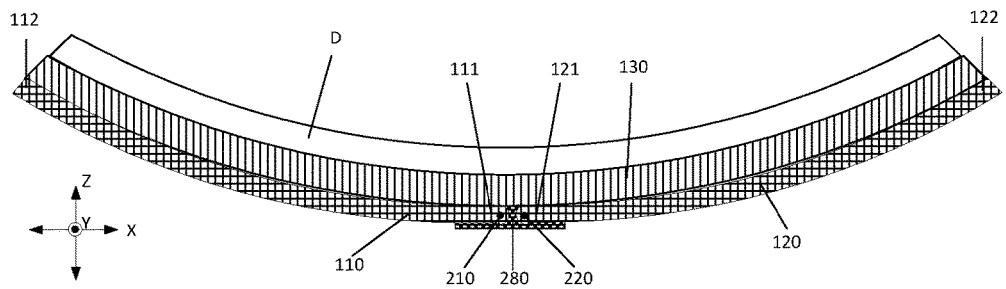
FIG. 15 is a sectional structure diagram of a display apparatus provided by an embodiment of the present disclosure in an X-Z plane direction.

In an example, as shown in FIGS. 14 and 15, the supporting device adopted in the display apparatus 1 provided by the third embodiment of the present disclosure is the supporting device provided by the embodiment as shown in FIG. 1. For example, rotating shafts 210 and 220 can be connected to the flexible display panel D. For example, a shaft sleeve 280 can be fixedly connected to a lower surface of the flexible display panel D. The first rotating shaft 210 and the second rotating shaft 220 are arranged on a lower surface of a flexible display panel 20 through the shaft sleeve 280. The shaft sleeve 280 can be independently manufactured and arranged on the flexible display panel D by engagement; or it can also be integrally machined and formed with the flexible display panel D.

In an example, as shown in FIG. 15, a third plate-shaped component 130 is further arranged between a first plate-shaped component 110 and the flexible display panel D as well as between a second plate-shaped component 120 and the flexible display panel D. For example, the rotating shafts 210 and 220 are connected to a lower surface of the third plate-shaped component 130.

For example, an elastic modulus of the third plate-shaped component 130 is less than that of a first plate-shaped component 110 and a second plate-shaped component 120.

For example, a vertical projection of the first plate-shaped component 110 on the flexible display panel D and a vertical projection of the second plate-shaped component 120 on the flexible display panel D do not exceed a vertical projection of the third plate-shaped component 130 on the flexible display panel D. That is, the vertical projections of the first plate-shaped component 110 and the second plate-shaped component 120 in an XY plane does not exceed that of the third plate-shaped component 130 in the XY plane.

For example, the flexible display panel adopted in the display apparatus 1 provided by the third embodiment of the present disclosure can be an OLED display panel, for example, the OLED display panel includes a package substrate, an array substrate and an organic electroluminescent structure located between the package substrate and the array substrate. In another example, the flexible display panel can also be a flexible display panel in other types such as an electronic ink flexible display screen.

In the display apparatus provided by the third embodiment of the present disclosure, a curvature of a display screen can be adjusted, which makes an optimum viewing distance adjustable and meets diversified requirements of the application scenarios.

Although the embodiment of the disclosure has been described above in great detail with general descriptions and specific embodiments, on the basis of the embodiment of the disclosure, various changes and improvements may be made, which is apparent to those skilled in the art. Therefore, all such changes and improvements without departing from the spirit of the disclosure are within the scope of the claims of the disclosure.

The present application claims priority of Chinese Patent Application No. 201510659415.4 filed on Oct. 12, 2015, the present disclosure of which is incorporated herein by reference in its entirety as part of the present application.

The invention claimed is:

1. A supporting device for a flexible display panel, comprising: a plate-shaped supporting component and a curvature adjusting component coupled to the plate-shaped supporting component, wherein, the plate-shaped supporting component includes two outer edge portions opposite to each other, at least a part of the curvature adjusting component is arranged between the two outer edge portions, and the curvature adjusting component is capable of bending the two outer edge portions of the plate-shaped supporting component towards a side of a plate surface of the plate-shaped supporting component, so as to obtain a bent supporting surface with different curvatures, wherein, the plate-shaped supporting component includes a fourth plate-shaped component, the curvature adjusting component includes at least one first elastic component, the at least one first elastic component is detachably connected to a main surface side of the fourth plate-shaped component, and the at least one first elastic component is capable of applying force to the fourth plate-shaped component so as to bend two outer edge portions of the fourth plate-shaped component towards a side of a plate surface of the fourth plate-shaped component, wherein, the fourth plate-shaped component includes a first main surface and a second main surface opposite each other, a first groove provided on the first main surface does not penetrate the second main surface of the fourth plate-shaped component, and the at least one first elastic component is detachably arranged on two opposite sides of the first groove in a straddling manner and/or is arranged in the first groove.

2. A supporting device for a flexible display panel, comprising: a plate-shaped supporting component and a curvature adjusting component coupled to the plate-shaped supporting component, wherein, the plate-shaped supporting component includes two outer edge portions opposite to each other, at least a part of the curvature adjusting component is arranged between the two outer edge portions, and the curvature adjusting component is capable of bending the two outer edge portions of the plate-shaped supporting component towards a side of a plate surface of the plate-shaped supporting component, so as to obtain a bent supporting surface with different curvatures, wherein, the plate-shaped supporting component includes a fourth plate-shaped component, the curvature adjusting component includes at least one first elastic component, the at least one first elastic component is detachably connected to a main surface side of the fourth plate-shaped component, and the at least one first elastic component is capable of applying force to the fourth plate-shaped component so as to bend two outer edge portions of the fourth plate-shaped component towards a side of a plate surface of the fourth plate-shaped component, wherein, the plate-shaped supporting component further includes a fifth plate-shaped component detachably installed on the main surface side of the fourth plate-shaped component, and the fifth plate-shaped component includes a second groove arranged to be communicated and overlapped with the first groove.

3. The supporting device according to claim 2, wherein, the curvature adjusting component includes at least one second elastic component, and the at least one second elastic component is detachably arranged on two opposite sides of the second groove in a straddling manner and/or is arranged in the second groove.

4. The supporting device according to claim 2, wherein, the first groove is not parallel to an edge of the fourth plate-shaped component.

5. A display apparatus, comprising a flexible display panel and a supporting device supporting the flexible display panel, wherein, the supporting device is the supporting device according to claim 2, and the flexible display panel is located on the side of the plate surface of the plate-shaped supporting component.

* * * * *